United States Patent
Zheng et al.

(10) Patent No.: US 9,263,431 B2
(45) Date of Patent: Feb. 16, 2016

(54) METHOD AND APPARATUS FOR INTEGRATED CIRCUIT PROTECTION

(71) Applicant: Fairchild Semiconductor Corporation, San Jose, CA (US)

(72) Inventors: Sam Zheng, Shanghai (CN); Gary Sun, Shanghai (CN); Steven M. Leibiger, Falmouth, ME (US); Tyler Daigle, Portland, ME (US); Julie Lynn Stultz, Scarborough, ME (US)

(73) Assignee: FAIRCHILD SEMICONDUCTOR CORPORATION, San Jose, CA (US)

( * ) Notice: Subject to any disclaimer, the term of this patent is extended or adjusted under 35 U.S.C. 154(b) by 546 days.

(21) Appl. No.: 13/862,008

(22) Filed: Apr. 12, 2013

(65) Prior Publication Data

US 2013/0292771 A1    Nov. 7, 2013

(30) Foreign Application Priority Data

Apr. 13, 2012   (CN) .......................... 2012 1 0113516

(51) Int. Cl.
*H02H 3/24* (2006.01)
*H01L 27/02* (2006.01)

(52) U.S. Cl.
CPC ........ *H01L 27/0266* (2013.01); *H01L 27/0255* (2013.01)

(58) Field of Classification Search
USPC .......................................................... 361/86
See application file for complete search history.

(56) References Cited

U.S. PATENT DOCUMENTS

| | | | | |
|---|---|---|---|---|
| 5,627,487 A * | 5/1997 | Keeth | ................. | H03K 19/0013 326/87 |
| 5,926,353 A | 7/1999 | Misek | | |
| 6,218,866 B1 * | 4/2001 | Poplevine | ........... | H01L 27/0629 257/E27.016 |
| 6,249,172 B1 * | 6/2001 | Ghilardelli | ............. | G11C 16/30 327/391 |
| 7,161,396 B1 * | 1/2007 | Zhou | ..................... | H03K 17/223 327/143 |
| 7,391,233 B1 * | 6/2008 | Bose | ....................... | G06F 1/3203 326/33 |
| 2005/0022488 A1 | 2/2005 | Conrad | | |
| 2005/0224883 A1 | 10/2005 | Huang et al. | | |
| 2007/0146048 A1 * | 6/2007 | Debroux | ................... | G05F 3/20 327/530 |
| 2013/0292771 A1 * | 11/2013 | Zheng | ................. | H01L 27/0266 257/355 |
| 2014/0197883 A1 * | 7/2014 | Sinha | ..................... | G05F 3/205 327/537 |

FOREIGN PATENT DOCUMENTS

CN    102710134 A    10/2012
CN    202651110 U    1/2013

OTHER PUBLICATIONS

"Chinese Application Serial No. 201010113516.8, Office Action mailed Apr. 22, 2015", w/ English Claims, 9 pgs.

* cited by examiner

*Primary Examiner* — Ronald W Leja
(74) *Attorney, Agent, or Firm* — Schwegman Lundberg & Woessner, P.A.

(57) ABSTRACT

In certain examples an integrated circuit protection circuit can include a circuit module, and an isolation device. The isolation device can be configured to couple a ground node of the circuit module to a power ground in an on state, and to isolate the ground node of the circuit module from the power ground in an off state, wherein the isolation module is configured to enter the off state when the IC receives a negative input voltage.

14 Claims, 5 Drawing Sheets

METHOD AND APPARATUS FOR INTEGRATED CIRCUIT PROTECTION

CLAIM OF PRIORITY

This application claims the benefit of priority under 35 U.S.C. 119 to China Patent Application Number, 201210113516.8, entitled, "INTEGRATED CIRCUIT AND ITS PROTECTION METHOD AND CIRCUIT," filed Apr. 13, 2012, hereby incorporated by reference herein in its entirety.

BACKGROUND

With the rapid development of the electronics, more and more integrated circuits (ICs) are applied to a variety of communication and electronic devices. The ICs integrate active components such as transistors, diodes etc. and passive components such as resistors, capacitors etc. on a wafer through certain circuit interconnections. IC wafers can use a P-type doping substrate (P-sub), which is generally connected to a power ground (grounded) by default.

When an input voltage of the IC is a negative voltage, −6 volts (V) for example, a P-sub in a wafer of the IC can be grounded and the voltage coupled to a N-well can the input voltage, a forward bias voltage of 6V, for example, can occur at a PN junction in the IC, e.g., between the P-sub and the Nwell, leading to a large current passing through the PN junction and possibly damaging or burning out the IC.

OVERVIEW

This application discusses, among other things, circuit protection technology, and in particular, methods and apparatus for integrated circuit (IC) protection. In certain examples, an integrated circuit protection circuit can include a circuit module, and an isolation device. The isolation device can be configured to couple a ground node of the circuit module to a power ground in an on state, and to isolate the ground node of the circuit module from the power ground in an off state, wherein the isolation module is configured to enter the off state when the IC receives a negative input voltage.

This overview is intended to provide a general overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
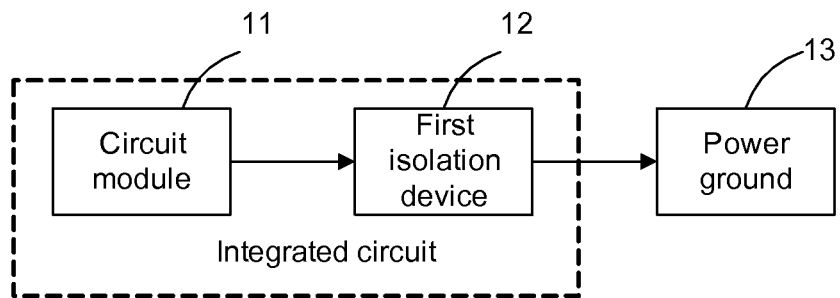
FIG. 1 illustrates generally an example IC protection circuit.

The inventors have recognized apparatus and methods for protecting integrated circuits for example to prevent a large current at a PN junction resulting from a negative input voltage from damaging the IC.

In certain examples, an IC protection circuit provided by this disclosure can include a circuit module, a first isolation device, and a power ground. The circuit module can be configured to connect its own ground node to the power ground via the first isolation device. The first isolation device can be configured to enter an off state and thus isolate the ground node of the circuit module from the power ground, when an IC input receives a negative voltage. The power ground can be configured to provide a voltage reference.

In certain examples, an IC can include a circuit module and a first isolation device. The circuit module can be configured to a ground node to a power ground via the first isolation device. The first isolation device can be configured to enter an off state and isolate the ground node of the circuit module from the power ground, when the IC receives a negative input voltage.

In certain examples, an IC protection can include arranging a first isolation device between a ground node of the IC and a power ground, wherein the first isolation device can enter an off state and thus isolates the ground node from the power ground when the IC receives a negative voltage at an input.

In certain examples, an IC protection circuit can include a circuit module, a second isolation device and a power ground, wherein the circuit module can be configured to couple an input voltage via the second isolation device, the second isolation device can be configured to enter an off state and thus prevent the negative voltage to input into the circuit module when the input voltage is a negative voltage, and the power ground can be configured to provide a voltage reference.

In the above examples, the second isolation device can be configured to enter an on state and thus input the input voltage into the circuit module, when the input voltage is a positive voltage.

In the above examples, the second isolation device can be a Schottky diode. In an example, the anode of the Schottky diode can be connected to a voltage input node of the circuit module, and the cathode of the Schottky diode can be connected to a node of the circuit module demanding the input voltage.

In certain examples, the second isolation device can be a P-Channel Metal-Oxide-Semiconductor (PMOS) device. In an example, the gate electrode of the PMOS device can be connected to a power ground, the source electrode of the PMOS device can be connected to the voltage input node of the circuit module, and the drain electrode of the PMOS device can be connected to the node of the circuit module demanding the input voltage.

In certain example, an IC can include a circuit module and a second isolation device, wherein the circuit module can be configured to be coupled to an input voltage via the second isolation device, and the second isolation device can be configured to enter an off state and thus prevent the negative voltage from being inputted into the circuit module, when the input voltage is a negative voltage.

In the some examples, the second isolation device can be configured to enter an on state and thus input the input voltage into the circuit module, when the input voltage is a positive voltage.

In some examples, the second isolation device can be a Schottky diode. In an example, the anode of the Schottky diode can be connected to a voltage input node of the circuit module, and the cathode of the Schottky diode can be connected to a node of the circuit module demanding the input voltage.

In certain examples, such as one or more of the examples provided above, the second isolation device can include a PMOS device. The gate electrode of the PMOS device can be connected to a power ground, the source electrode of the PMOS device can be connected to the voltage input node of the circuit module, and the drain electrode of the PMOS device can be connected to the node of the circuit module demanding the input voltage.

In certain examples, a protection method of an IC can include arranging a second isolation device at a voltage input node of the IC, wherein the second isolation device can enter an off state and thus prevents a negative voltage from being inputted into the IC, when the IC inputs a negative voltage.

In some examples, the second isolation device can be arranged to enter an on state and thus input the input voltage into the IC when the IC inputs a positive voltage.

In the above solution, the second isolation device may be a Schottky diode or a PMOS device.

In certain examples, a IC protection circuit or IC protection method can include a first isolation device arranged between a ground node of the IC and a power ground such that the first isolation device can isolate the ground node from the power ground when the IC inputs a negative voltage. Thus, the ground node of the IC can be isolated from the power ground when the IC inputs a negative voltage, such that a forward bias voltage may be avoided from occurring at the PN junction in the IC, thus preventing the current passing through the PN junction from being too large, and protecting the IC from being burned out.

In certain examples, an IC protection apparatus or an IC protection method can include a first isolation device arranged between a ground node of an IC and a power ground. When the IC inputs a negative voltage, the first isolation device can enter an off state, and can isolate the ground node from the power ground.

FIG. 1 illustrates generally an example IC protection circuit that can include a circuit module 11, a first isolation device 12 and a power ground 13. The circuit module 11 can be configured to connect a ground node of the circuit module 11 to the power ground 13 via the first isolation device 12. The first isolation device 12 can be configured to enter an off state and can isolate the ground node of the circuit module 11 from the power ground 13, when the IC inputs or receives a negative input voltage. In certain examples, the power ground 13 is configured to provide a voltage reference.

In certain examples, the first isolation device 12 can be configured to enter an on state and can connect the ground node of the circuit module 11 to the power ground 13, when the IC inputs a positive voltage. In some examples, the power ground 13 can be a ground node in a printed circuit board where the IC is located.

In Certain examples, the first isolation device 12 can include a diode, such as a Schottky diode, or a Metal-Oxide-Semiconductor (MOS) device, such as a N-Mental-Oxide-Semiconductor (NMOS) device, and so on. In examples where the first isolation device 12 includes a Schottky diode, the anode of the Schottky diode can be connected to the ground node of the circuit module 11 and the cathode of the Schottky diode can be connected to the power ground 13.

In examples where the first isolation device includes a NMOS device, the gate electrode of the NMOS can be connected to the voltage input node of the IC, the source electrode of the NMOS device can be connected to the ground node of the circuit module 11, and the drain electrode of the NMOS device can be connected to the power ground 13. The voltage input node is the input voltage accessing terminal of the IC. In certain examples, a voltage stabilizing diode can be connected between the gate electrode and the source electrode of the NMOS device. The voltage stabilizing diode can be configured to stabilize a voltage of the gate electrode. In some examples, a resistor can be connected between the gate electrode of the NMOS device and the voltage input node of the IC. The resistor can limit a current passing through the voltage stabilizing diode. In certain examples, the circuit module 11 of the IC can be used with a variety of functional circuits, such as an inverter circuit, a comparator circuit, a switch circuit, etc.

Figure 2:
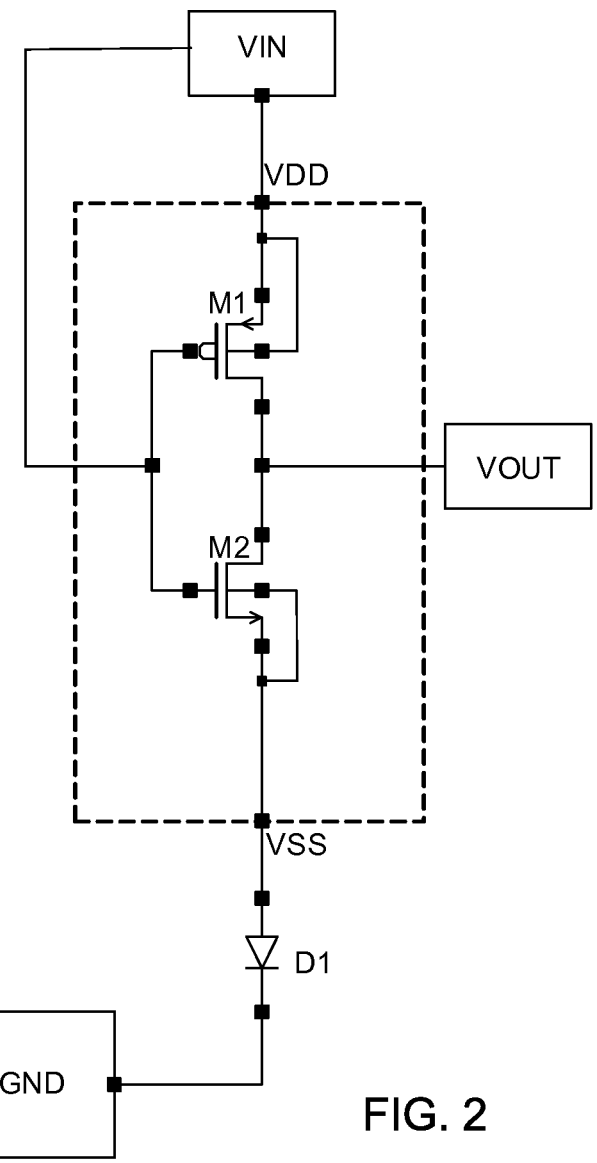
FIG. 2 illustrates generally an example IC protection circuit.

FIG. 2 illustrates generally a IC including an example protection circuit. A circuit module 11 of the IC is a Complementary Metal Oxide Semiconductor (CMOS) inverter circuit, and the first isolation device is a Schottky diode D1. The anode of the Schottky diode D1 is connected to a ground node VSS of the CMOS inverter circuit, e.g., the source electrode of NMOS M2 in the CMOS inverter circuit. The cathode of the Schottky diode D1 is connected to a power ground GND. A power node VDD of the CMOS inverter circuit is connected to a voltage input node VIN. When the voltage input node VIN inputs a positive voltage, a P-Channel Metal Oxide Semiconductor (PMOS) device M1 is turned off and the NMOS device M2 is turned on in the CMOS inverter circuit, the Schottky diode D1 is turned on, the P-sub of the NMOS M2 is connected to the power ground GND, and a voltage of 0V is outputted at an output node VOUT. When a negative voltage is inputted at the voltage input node VIN, the PMOS device M1 is turned on and the NMOS device M2 is turned off in the CMOS inverter circuit, the Schottky diode D1 is turned off, the ground node VSS of the CMOS inverter circuit is isolated from the power ground GND, the P-sub of the NMOS device M2 is isolated from the power ground GND, and a voltage equal to that at the voltage input node VIN is outputted at the output node VOUT. Accordingly, the PN junction in the IC cannot generate a forward bias voltage, and the current passing through the PN junction is not large.

In certain examples, the Schottky diode D1 and the CMOS inverter circuit can be integrated in one wafer as an IC.

Figure 3:
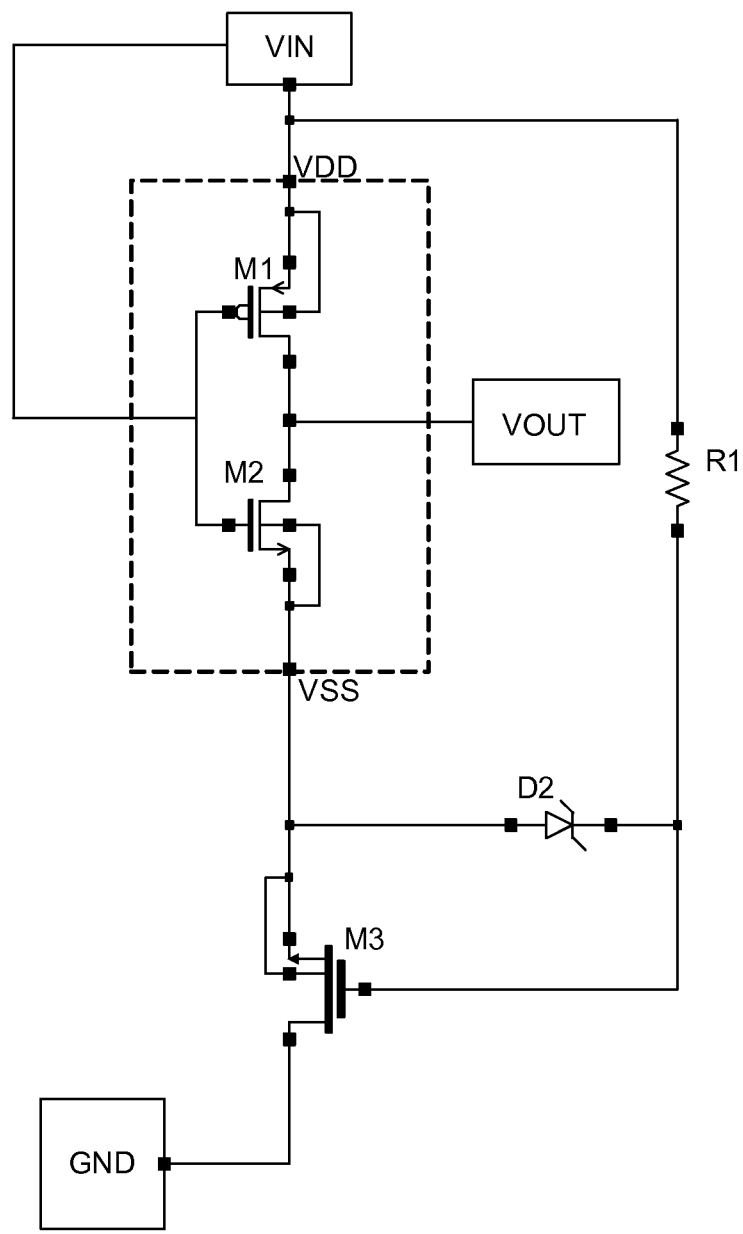
FIG. 3 illustrates generally an example IC protection circuit.

FIG. 3 illustrates generally an IC including an example protection circuit. A circuit module 11 in the IC can include a CMOS inverter circuit, and the first isolation device can include an NMOS device M3. The source electrode of the NMOS device M3 can be connected to a ground node VSS of the CMOS inverter circuit, e.g., the source electrode of a NMOS device M2 in the CMOS inverter circuit. The drain electrode of the NMOS device M2 can be connected to a power ground GND. The gate electrode of the NMOS device M2 can be connected to a power node VDD of the CMOS inverter circuit and a voltage input node VIN. When a positive voltage is inputted at the voltage input node VIN, a PMOS device M1 can turn off and the NMOS device M2 can turn on in the CMOS inverter circuit. The NMOS device M3 can turn on. P-subs of the NMOS device M2 and the NMOS device M3 can be connected to the power ground GND, and a voltage of 0V can be output at an output node VOUT. When a negative voltage is inputted at the voltage input node VIN, the PMOS device M1 can turn on and the NMOS M2 can turn off in the CMOS inverter circuit, the NMOS device M3 can turn off, the ground node VSS of the CMOS inverter circuit can be isolated from the power ground GND, the P-subs of the NMOS device M2 and the NMOS device M3 can be isolated from the power ground GND, and a voltage equal to that at the voltage input node VIN can be outputted at the output node VOUT. Accordingly, a PN junction in the IC does generate a forward bias voltage, and the current passing through the PN junction is not large.

In certain examples, a voltage stabilizing diode D2 can be connected between the gate electrode and the source electrode of the NMOS device M3, and the voltage stabilizing diode D2 can be configured to stabilize a voltage at the gate electrode of the NMOS device M3.

In certain examples, a resistor R1 can be connected between the gate electrode of the NMOS device M3 and the power node VDD as well as the voltage input node VIN, and the resistor R1 can be configured to limit a current passing through the voltage stabilizing diode D2.

Figure 4:
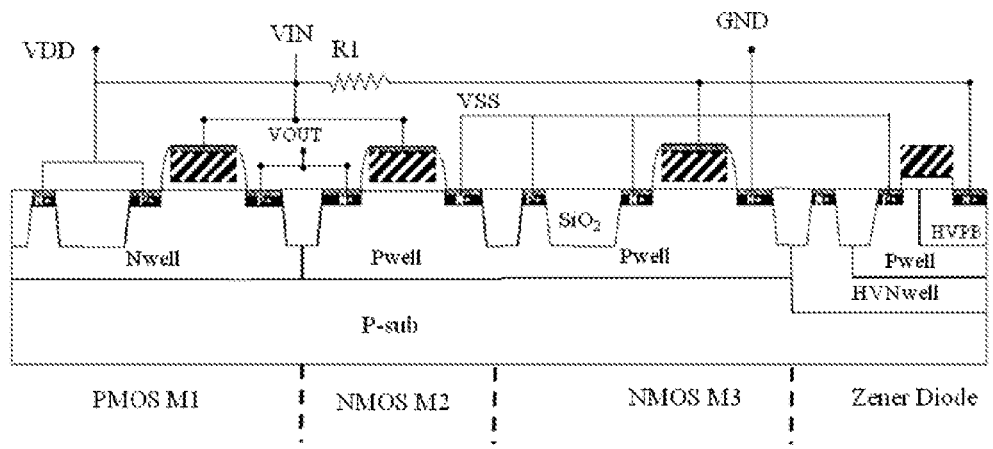
FIG. 4 illustrates generally a structural schematic view of an example isolation device.

In certain examples, the NMOS device M3 and the voltage stabilizing diode D2, the resistor R1, and the CMOS inverter circuit may generally be integrated in an IC. As shown in FIG. 4, the NMOS device M3, the voltage stabilizing diode D2, the resistor R1, and the CMOS inverter circuit can be integrated in a wafer. In some examples, the voltage stabilizing diode D2 can be a Zener diode. The wafer can use a P-sub substrate, the area filled with oblique lines represents a polycrystalline silicon layer, an isolation area is a gate oxide layer, and the isolation area is mainly formed of SiO2. The Pwell represents a P-well, the Nwell represents a N-well, the HVNwell represents a high voltage N-well, and the HVPB represents a high voltage P-well. Thus, what is arranged between the N well of the PMOS device M1 and the P-sub in the CMOS inverter circuit is equivalent to a parasitic diode DP1, the anode of the DP1 is connected to the P-sub, and the cathode of the DP1 is connected to the N-well. What is arranged between the P-well of the PMOS device M3 and a buried layer N+ is equivalent to a parasitic diode DP2, the anode of the DP2 is connected to the P-well, and the cathode of the DP2 is connected to the N+. When a positive voltage is inputted at the voltage input node VIN, the PMOS device M1 is turned off and the NMOS device M2 is turned on in the CMOS inverter circuit, the NMOS device M3 is turned on, which is equivalent to that the DP1 and the DP2 are turned on, the P-sub is connected to the power ground GND, and a voltage of 0V is outputted at an output node VOUT. When a negative voltage is inputted at the voltage input node VIN, the PMOS device M1 is turned on and the NMOS device M2 is turned off in the CMOS inverter circuit, the NMOS device M3 is turned off, which is equivalent to that the DP1 and the DP2 are turned off, the ground node VSS of the CMOS inverter circuit is isolated from the power ground GND, the P-subs is isolated from the power ground GND, and a voltage equal to that at the voltage input node VIN is outputted at the output node VOUT, so that a PN junction in the IC cannot generate a forward bias voltage, and the current passing through the PN junction is not large.

An example IC implemented as described above is illustrated generally in FIG. 1, which includes a circuit module 11 and a first isolation device 12.

The circuit module 11 is configured to connect its own ground node to a power ground 13 via the first isolation device 12.

The first isolation device 12 is configured to enter an off state and thus isolate the ground node of the circuit module 11 from the power ground 13, when the IC inputs a negative voltage.

The first isolation device 12 is further configured to enter an on state and thus connect the ground node of the circuit module 11 to the power ground 13, when the IC inputs a positive voltage.

The first isolation device 12 may be a diode, such as a Schottky diode, or a MOS device, such as a NMOS device, and so on.

When the first isolation device 12 is a Schottky diode, the anode of the Schottky diode is connected to the ground node of the circuit module 11 and the cathode of the Schottky diode is connected to the power ground 13.

When the first isolation device 12 is a NMOS device, the gate electrode of the NMOS device is connected to a voltage input node of the IC, the source electrode of the NMOS device is connected to the ground node of the circuit module 11, and the drain electrode of the NMOS device is connected to the power ground 13; and the voltage input node is an input voltage accessing terminal of the IC.

Further, a voltage stabilizing diode is connected between the gate electrode and the source electrode of the NMOS device, and the voltage stabilizing diode is configured to stabilize the voltage at the gate electrode.

Further, a resistor is connected between the gate electrode of the NMOS device and the voltage input node of the IC. The resistor is configured to limit a current passing through the voltage stabilizing diode.

According to the IC protection method implemented by the first solution of the disclosure, a first isolation device is arranged between a ground node of the IC and a power ground. Additionally, when the IC inputs a negative voltage, the first isolation device enters an off state and thus isolates the ground node from the power ground.

Further, according to the method, when the IC inputs a positive voltage, the first isolation device may enter an on state and thus connect the ground node to the power ground.

The first isolation device 12 may be a diode, such as a Schottky diode, or a MOS device, such as a NMOS device, and so on;

Further, according to the method, when the first isolation device is a NMOS device, a voltage stabilizing diode for stabilizing a voltage of the gate electrode may be arranged between the gate electrode and the source electrode of the NMOS device, and a resistor for limiting a current passing through the voltage stabilizing diode may be arranged between the gate electrode of the NMOS device and a voltage input node of the IC.

The basic idea of the second solution of the disclosure is to arrange a second isolation device at a voltage input node of the IC, such that the IC may not receive a negative input voltage.

Figure 5:
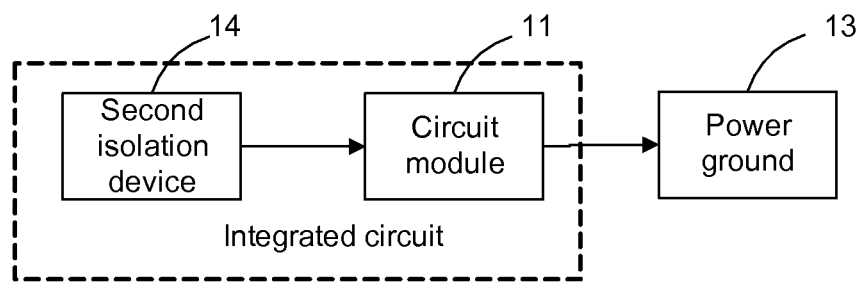
FIG. 5 illustrates generally an example IC protection circuit.

An example IC protection circuit solution is illustrated generally in FIG. 5, which includes a circuit module 11, a second isolation device 14 and a power ground 13.

The circuit module 11 is configured to be coupled to an input voltage via the second isolation device 14.

The second isolation device 14 is configured to enter an off state and thus prevent the negative voltage from being inputted into the circuit module 11, when the input voltage is a negative voltage.

The power ground 13 is configured to provide a voltage reference.

Further, the second isolation device 14 may be configured to enter an on state and thus input the input voltage into the circuit module 11, when the input voltage is a positive voltage.

The power ground 13 may be a ground node of a printed circuit board where the IC is located, and so on. The second isolation device 14 may be a diode, such as a Schottky diode, or a MOS device, such as a PMOS device, and so on.

When the second isolation device 14 is a Schottky diode, the anode of the Schottky diode is connected to a voltage input node of the circuit module 11 to receive the input voltage, and the cathode of the Schottky diode is connected to a node of the circuit module 11 demanding the input voltage, such as a power node, an input node etc. in the circuit module 11.

When the second isolation device 14 is a PMOS device, the gate electrode of the PMOS device is connected to a power ground 13, the source electrode of the PMOS device is connected to the voltage input node of the circuit module 11 to receive an input voltage, and the drain electrode of the PMOS device is connected to the node of the circuit module demanding the input voltage 11.

The circuit module 11 in the IC may be any functional circuit, such as an inverter circuit, a comparator circuit, or a switch circuit, etc.

Figure 6:
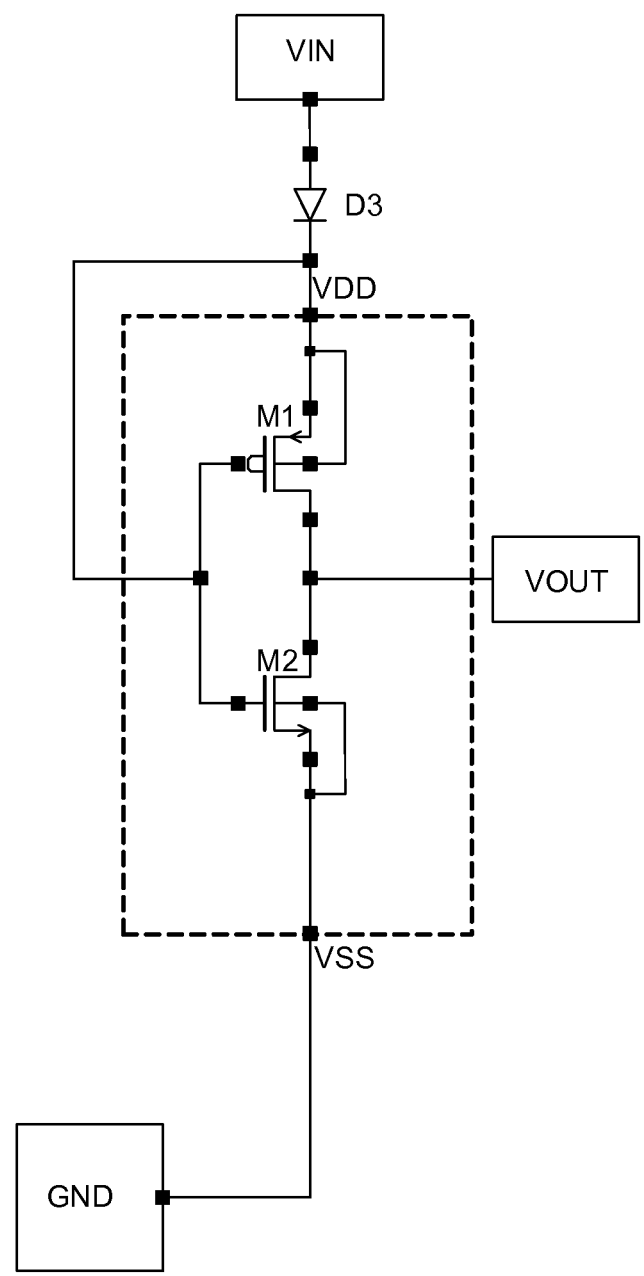
FIG. 6 illustrates generally an example IC protection circuit.

FIG. 6 illustrates generally an example IC including a CMOS inverter circuit module 11, and a second isolation device including Schottky diode D3. The anode of the Schottky diode D3 is connected to a voltage input node VIN of the CMOS inverter circuit. The cathode of the Schottky diode D3 is connected to a power node VDD, the gate electrode of the PMOS device M1 and the gate electrode of the NMOS device M2. A ground node VSS of the CMOS inverter circuit is connected to the power ground GND. When the voltage input node VIN inputs a positive voltage, the Schottky diode D3 is turned on, the PMOS device M1 is turned off and the NMOS device M2 is turned on in the CMOS inverter circuit, and a voltage of 0V is outputted at an output node VOUT. When the voltage input node VIN inputs a negative voltage, the Schottky diode D3 is turned off, and the negative voltage cannot be transmitted to the CMOS inverter circuit. Accordingly, a PN junction in the IC cannot generate a forward bias voltage, and the current passing through the PN junction is not large.

In certain examples, the Schottky diode D3 and the CMOS inverter circuit may generally be integrated on one wafer as an IC.

Figure 7:
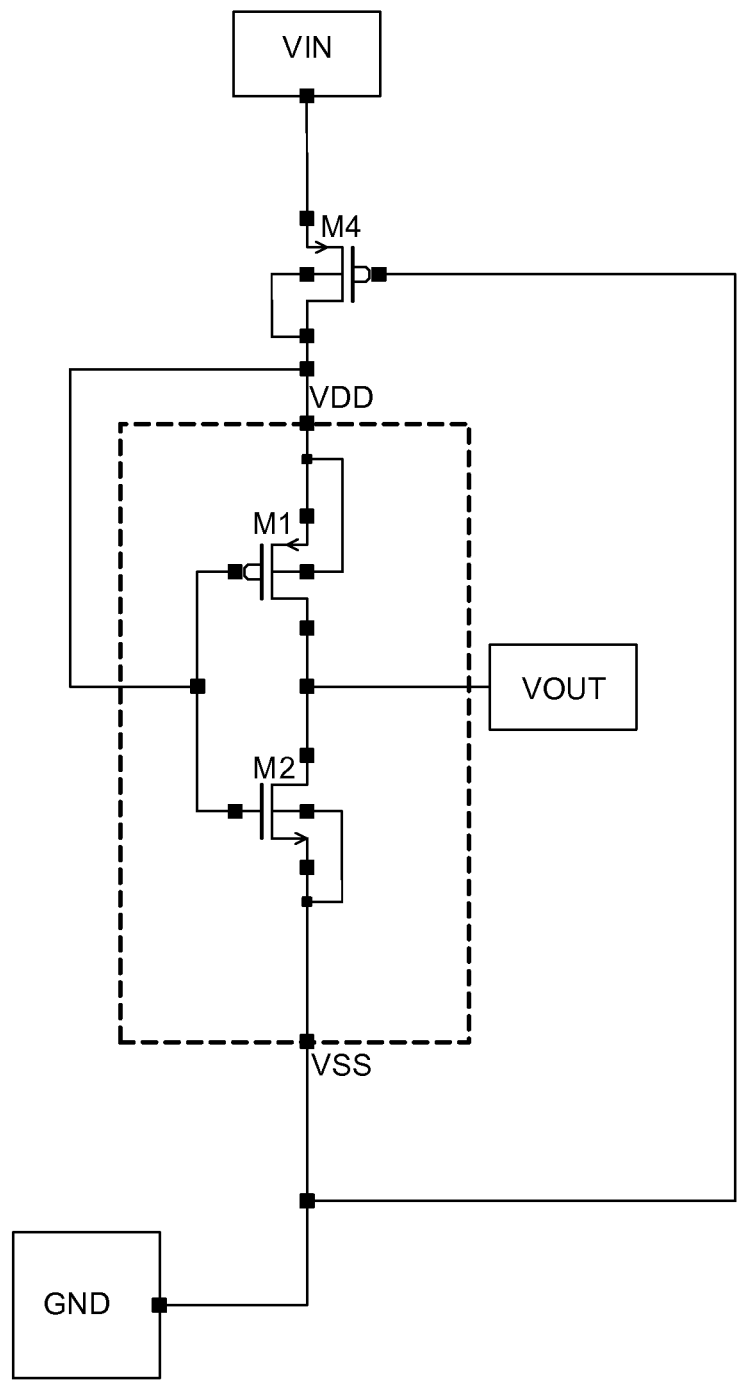
FIG. 7 illustrates generally an example IC protection circuit.

FIG. 7 illustrates generally a circuit module 11 of an IC including a CMOS inverter circuit, and a second isolation device including PMOS device M4. The source electrode of the PMOS device M4 is connected to a voltage input node VIN of the CMOS inverter circuit. The drain electrode of the PMOS device M4 is connected to a power node VDD, the gate electrode of the PMOS device M1 and the gate electrode of the NMOS device M2. The gate electrode of the PMOS device M4 is connected to a power ground GND. The substrate of the PMOS device M4 is connected its own drain electrode. A ground node VSS of the CMOS inverter circuit is also connected to the power ground GND. When the voltage input node VIN inputs a positive voltage, the PMOS device M4 is turned on, the PMOS device M1 is turned off and the NMOS device M2 is turned on in the CMOS inverter circuit, and a voltage of 0V is outputted at an output node VOUT. When the voltage input node VIN inputs a negative voltage, the PMOS device M4 is turned off, and the negative voltage cannot be transmitted to the CMOS inverter circuit. Accordingly, a PN junction in the IC cannot generate a forward bias voltage, and the current passing through the PN junction is not large.

In certain examples, the PMOS device M4 and the CMOS inverter circuit may generally be integrated in one wafer as an IC.

An example IC implemented as described above is illustrated generally in FIG. 5, which comprises a circuit module 11 and a second isolation device 14.

The circuit module 11 is configured to couple an input voltage via the second isolation device 14.

The second isolation device 14 is configured to enter an off state and thus prevent the negative voltage from being inputted into the circuit module 11, when the input voltage is a negative voltage.

The second isolation device 14 is further configured to enter an on state and thus input the input voltage into the circuit module 11, when the input voltage is a positive voltage.

The second isolation device 14 may be a diode, such as a Schottky diode, or a MOS device, such as a PMOS device, and so on.

When the second isolation device 14 is a Schottky diode, the anode of the Schottky diode is connected to a voltage input node of the circuit module 11 to receive the input voltage, and the cathode of the Schottky diode is connected to a node of the circuit module 11 demanding the input voltage.

When the second isolation device 14 is a PMOS device, the gate electrode of the PMOS device is connected to a power ground 13, the source electrode of the PMOS device is connected to the voltage input node of the circuit module 11 to receive the input voltage, and the drain electrode of the PMOS device is connected to the node of the circuit module demanding the input voltage 11.

The circuit module 11 of the IC may be any functional circuit, such as an inverter circuit, a comparator circuit, or a switch circuit, etc.

An IC protection method implemented by the second solution of the disclosure includes arranging a second isolation device at a voltage input node of the IC, wherein the second isolation device enters an off state and thus prevents a negative voltage from being inputted into the IC when the IC receives a negative input voltage.

In certain examples, the second isolation device 14 is further arranged to enter an on state and input the input voltage into the IC when the IC receives a positive input voltage.

The second isolation device may be a diode, such as a Schottky diode, or a MOS device, such as a PMOS device, and so on.

In summary, the solutions of the disclosure implement the isolation of the ground node of the IC from the power ground when the IC inputs a negative voltage, which avoids generating a forward bias voltage at the PN junction in the IC, thereby preventing a large current from passing through the PN junction, and protecting the IC from being burned out.

The above descriptions are examples of the disclosure, and are not intended to limit the protection scope of the disclosure.

Additional Notes and Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations and permutations. The scope of the invention should be determined with reference to the appended claims, along with the full scope of equivalents to which such claims are entitled.

What is claimed is:

1. An integrated circuit (IC) protection circuit, comprising:
a circuit module;
a first isolation device; and
wherein the isolation device is configured to couple a ground node of the circuit module to a power ground in an on state, and to isolate the ground node of the circuit module from the power ground in an off state, wherein the isolation device is configured to enter the off state when the IC receives a negative input voltage.

2. The protection circuit of claim 1, wherein the first isolation device is configured to enter the on state when the IC receives a positive input voltage.

3. The protection circuit of claim 1, wherein, the first isolation device is a Schottky diode;
wherein an anode of the Schottky diode is connected to the ground node of the circuit module; and
wherein a cathode of the Schottky diode is connected to the power ground.

4. The protection circuit of claim 1, wherein, the first isolation device is an N-channel metal-oxide semiconductor (NMOS) device;
wherein a gate electrode of the NMOS device is connected to a voltage input node of the IC,
wherein a source electrode of the NMOS device is connected to the ground node of the circuit module; and
wherein a drain electrode of the NMOS device is connected to the power ground.

5. The protection circuit of claim 4, further comprising:
a voltage stabilizing diode connected between the gate electrode and the source electrode of the NMOS device, and configured to stabilize a voltage at the gate electrode; and
a resistor connected between the gate electrode of the NMOS device and the voltage input node of the IC, and configured to limit a current passing through the voltage stabilizing diode.

6. An integrated circuit (IC), comprising:
a circuit module;
a first isolation device; and
wherein the isolation device is configured to couple an input terminal of the IC to the circuit module in an on state, and to isolate the circuit module from the input terminal in an off state, wherein the isolation module is configured to enter the off state when a negative input voltage is received on the input terminal.

7. The IC of claim 6, wherein the first isolation device is configured to enter the on state when a positive input voltage is received on the input terminal.

8. The IC of claim 6, wherein the first isolation device is a Schottky diode,
wherein an anode of the Schottky diode is connected to the input terminal; and
wherein a cathode of the Schottky diode is connected to an input of the circuit module.

9. The IC of claim 8, wherein the circuit module includes an inverter and the cathode of the Schottky diode is connected to a voltage supply of the inverter and to an input of the inverter.

10. The IC of claim 6, wherein the first isolation device is a P-channel metal-oxide semiconductor (PMOS) device,
wherein a gate electrode of the PMOS device is connected to a power ground of the IC;
wherein a source electrode of the PMOS device is connected to the input terminal; and
wherein a drain electrode of the PMOS device is connected to an input of the circuit module.

11. An integrated circuit (IC) protection method, comprising:
- receiving a negative input voltage at an integrated circuit (IC);
- isolating a circuit module of the IC from a power ground in response to the negative input voltage using an off state of an isolation device arranged between the ground node of the IC and the power ground.

12. The IC protection method of claim 11, including receiving a positive input voltage at the integrated circuit; and
- connecting the circuit module with the power ground in response to the positive input voltage using an on state of the isolation device.

13. The IC protection method of claim 11, wherein isolating a circuit module of the IC from a power ground includes isolating the circuit module of the IC from the power ground in response to the negative input voltage using an off state of an N-channel metal-oxide semiconductor (NMOS) device arranged between the ground node of the IC and the power ground.

14. The IC protection method of claim 13, including
- stabilizing a voltage at a gate electrode of the NMOS device using a voltage stabilizing diode transistor coupled between the gate electrode and a source electrode of the NMOS device; and
- limiting current passing through the voltage stabilizing diode using a limit resistor coupled between the gate electrode and a voltage input of the IC.

* * * * *